United States Patent [19]

Kin

[11] Patent Number: 5,157,283
[45] Date of Patent: Oct. 20, 1992

[54] TREE DECODER HAVING TWO BIT PARTITIONING

[75] Inventor: Tae-hun Kin, Chungnosong, Rep. of Korea

[73] Assignee: Samsung Electronics Co., Ltd., Suwon, Rep. of Korea

[21] Appl. No.: 769,573

[22] Filed: Oct. 2, 1991

Related U.S. Application Data

[63] Continuation of Ser. No. 382,272, Jul. 20, 1989, abandoned.

[30] Foreign Application Priority Data

Dec. 23, 1988 [KR] Rep. of Korea ............... 17337/88

[51] Int. Cl.$^5$ ............... H03K 17/16; H03K 19/20
[52] U.S. Cl. ............... 307/449; 307/443; 307/448; 307/451; 307/463
[58] Field of Search ............... 307/443, 448, 451, 449, 307/463

[56] References Cited

U.S. PATENT DOCUMENTS

| | | | |
|---|---|---|---|
| 4,433,257 | 2/1984 | Kinoshita | 307/449 |
| 4,684,829 | 8/1987 | Uratani | 307/449 |
| 4,724,341 | 2/1988 | Yamada et al. | 307/469 |
| 4,725,742 | 2/1988 | Tachimori et al. | 307/463 |
| 4,730,133 | 3/1988 | Yoshida | 307/449 |

*Primary Examiner*—Stanley D. Miller
*Assistant Examiner*—Margaret Rose Wambach
*Attorney, Agent, or Firm*—Robert E. Bushnell

[57] ABSTRACT

Disclosed is a decoder circuit designed to reduce the number of transistor elements and to increase the speed of operation. The decoder includes a plurality of output selectors for respectively drawing out different decoded output signal lines in group having the common input components. In each output selector, a plurality of serial-connected transistors is provided to execute AND operations for the common input components, and a plurality of parallel-connected transistors to execute OR operation for the remaining and their remaining inverted input components. The final one of the serial-connected transistors is coupled to each of parallel-connected transistors, and thereby the entire AND operation results for the common inputs and remaining inputs, or for the common inputs and remaining inverted inputs is obtained at the predetermined one of the decoded output signal lines.

24 Claims, 3 Drawing Sheets

TREE DECODER HAVING TWO BIT PARTITIONING

This is a continuation of application Ser. No. 07/382,272 filed on Jul. 20, 1989 now abandoned.

BACKGROUND OF THE INVENTION

1. Field of the Invention

The present invention relates to a decoder that outputs a signal to the output port corresponding the combination of input signals applied, in particular, to a decoder using a level shifter that improves economy by reducing the area occupied in the chip and by increasing the operational speed.

2. Description of the Prior Art

In general, the decoder, which is used as a typical function circuit for the combination of gates within various digital systems such as 1-chip microprocessors, custom integrated circuit (IC's), and controllers for electrical devices, performs the role of finding the memory address by decoding the data from various combinations of signals. Therefore, the decoder that is used within a digital system as a function circuit for control purposes consists of a combination of several complementary metal oxide semiconductor NAND or NOR gates, which occupy a large area of semiconductor chip. As a result, the unit price and yields can be affected, since the decoder occupies a large portion of the digital system and, accordingly, the circuit operates with limited speed of operation.

For example, as shown in FIG. 1, let's consider a 3-input decoder composed of CMOS NOR gates. In the circuit, based upon each combination of the 3 input signals A,B, and C, 8 NOR gates are requisite to find a specific bit line using the decoder, because we must select a specific piece of data out of 8 outputs 01 thorugh 08. In this case, three p-channel transistors should be connected in parallel with the serially connected three n-channel transistors per NOR gate; hence six transistors are required in total. In the line run, a total of 48 transistors are used in a 3-input decoder. In the case of a 4-input decoder, not only is a combination of 96 transistors and their corresponding area required, but there is also the disadvantage of having limited operational speed, since the speed of setting an output for the 3-input decoder corresponds to the delay time of the three p-channel transistors.

SUMMARY OF THE INVENTION

The purpose of this invention is to provide a decoder using a level shifter that improves the overall economy of the circuit by reducing the number of transistors constituting the decoder, and by increasing the speed of operation.

According to the features of the present invention, a decoder circuit for generating the decoded signal is provided to one specific output line in response to the input signals of a specific combination, said decoder circuit including a plurality of output selectors for respectively drawing out different decoded output signal lines in a group having the common input components.

Each of the output selectors is provided with a plurality of serial-connected transistors for executing logic AND operations for the common input components received by the respective gates thereof, and a plurality of parallel-connected transistors for executing logic OR operations for the remaining input components and the remaining inverted input components received by the respective gates thereof.

The coupled sources (or drains) of the parallel-connected transistors are connected to the drain (or source) of the final one of the serial-connected transistors while the different decoded output signal lines are drawn from the respective drains (or sources) of the parallel-connected transistors. Therefore, logic AND operation results may be selectively output to one of the decoded output signal lines for the common inputs and remaining inputs, or for the common inputs and remaining inverted inputs, based upon the conditions of these remaining inputs.

BRIEF DESCRIPTION OF THE DRAWINGS

The above objects and other advantages of the present invention will become more apparent in the following detailed description of the preferred embodiment of the present invention, with reference to the attached drawings, in which.

DETAILED DESCRIPTION OF THE PREFERRED EMBODIMENT

A preferred embodiment of the invention will be explained in detail by referring to FIG. 2 and FIG. 3.

Figure 3:
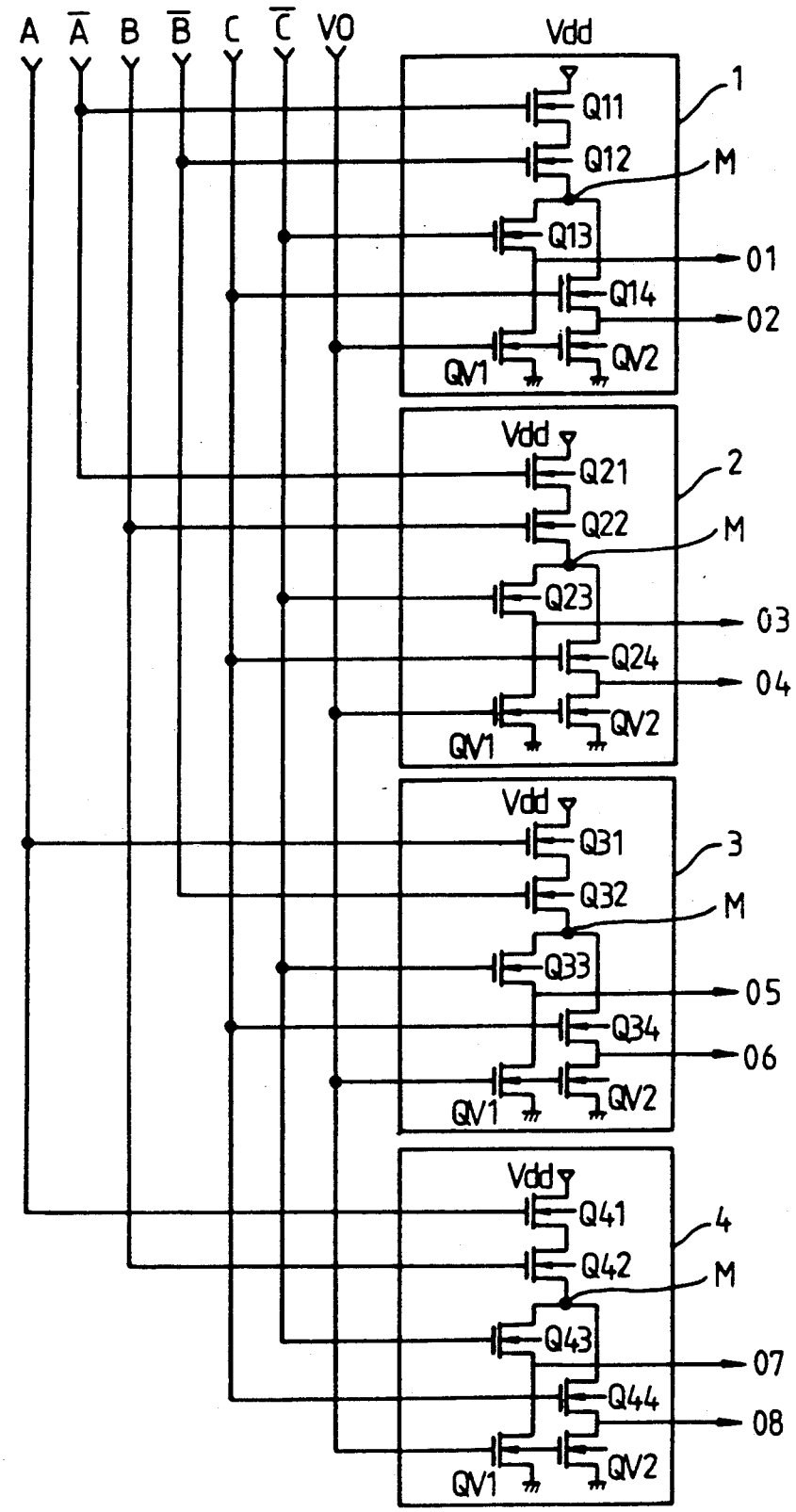
FIG. 3 shows a circuit diagram illustrating the structure of the 3-input decoder of the invention, using the level shifter.

FIG. 3 is a circuit diagram depicting an example of the operation of the invention, the 3-input decoder. The structure is as follows;

Assume that A,B and C are the three inputs and $\overline{A},\overline{B}$, and $\overline{C}$ are the inverted signals of the 3 inputs. 01, 02, 03, 04, 05, 06, 07, and 08 represent outputs of the decoder. In this invention, only the n-channel transistors are used for the decoder, since the drift velocity of an electron is three times faster than that of a hole and, hence, the structure of the circuit can be simplified and the operational speed can be increased.

TABLE 1

| A | B | C | Decoder Output |
|---|---|---|----------------|
| 0 | 0 | 0 | 01 |
| 0 | 0 | 1 | 02 |
| 0 | 1 | 0 | 03 |
| 0 | 1 | 1 | 04 |
| 1 | 0 | 0 | 05 |
| 1 | 0 | 1 | 06 |
| 1 | 1 | 0 | 07 |
| 1 | 1 | 1 | 08 |

The decoder, which outputs logic "1" to one of eight outputs according to the condition of the three inputs, follows the logic table shown in Table 1. Here, if the logic "1" signal appears at output 01, the circuit must be constructed to satisfy the logic expression $01=\overline{A}\cdot\overline{B}\cdot\overline{C}$. In the same manner, for outputs 02-08, the circuits satisfying the logic expressions $02=\overline{A}\cdot\overline{B}\cdot C$, $03=\overline{A}\cdot B\cdot\overline{C}$, $04=\overline{A}\cdot B\cdot C$, $05=A\cdot\overline{B}\cdot\overline{C}$, $06=A\cdot\overline{B}\cdot C$, $07=A\cdot B\cdot\overline{C}$, and $08=A\cdot B\cdot C$ must be accordingly constructed.

In order to construct the circuits for generating the outputs 01-08, the invention utilizes the following characteristic scheme to simplify the complexity of the circuit.

First, for the outputs (01–08) having these logical expressions the outputs having the same input components are so grouped as to be drawn from one output selector unit. For example, the outputs 01 and 02 are configured to be drawn from the same output selector unit 1, since they have the same input component $\overline{A} \cdot \overline{B}$. The following output pairs are drawn from the output selector units 2, 3, and 4 since 03 and 04 have the common input $\overline{A} \cdot B$, 05 and 06 have $A \cdot \overline{B}$, and 07 and 08 have $A \cdot B$, respectively. Moreover, in this invention, in order to minimize the number of metal oxide semiconductor transistors that form the output selector construction, the common inputs included in these different outputs are arranged to use the same transistors at the corresponding output selector unit. Therefore, the common inputs in this example are individually applied to the gates of the serially connected transistors that execute the logical AND operation i.e. to perform preliminary logic products within the corresponding output selector unit. That is to say, for the different outputs 01 and 02 that have a common input $\overline{A} \cdot \overline{B}$, the common inputs $\overline{A}$ and $\overline{B}$ are applied to the gates of the serially connected transistors Q11 and Q12 in the output selector 1. In the same way, the common inputs $\overline{A}$ B for outputs 03 and 04 are applied to the gates of the transistors Q21 and Q22 in output selector 2, the common input A and $\overline{B}$ for output 05 and 06 are applied to the gates of the transistors Q31 and Q32 in output selector 3, and the common input A and B for output 07 and 08 are applied to the gates of transistors Q41 and Q42 in output selector 4.

In addition, for the input conditions to the output pairs (01, 02), (03, 04), (05, 06), and (07, 08), the remaining inputs, and the inverted inputs C and $\overline{C}$ are respectively applied to each gate of the parallel-connected transistors (Q13, Q14), (Q23, Q24), (Q33, Q34), and (Q43, Q44), which execute the logical OR operations, i.e., perform secondary logic products within the corresponding output selector units 1, 2, 3, and 4 to generate secondary logic products. Moreover, the drains of the final ones Q12, Q22, Q32, and Q42 among the serially connected transistors within the respective output selector units 1, 2, 3, and 4 are joined with the sources of the parallel-connected transistors (Q13, Q14), (Q23, Q24), (Q33, Q34), and (43, Q44); and different decoding outputs 01,02,03,04,05,06,07, and 08 are drawn from the drains of the parallel-connected transistor pairs (Q13,Q14), (Q23,Q24), (Q33,Q34), and (Q43,Q44). With this configuration, logical AND operation results i.e., to perform an output logic operation to generate output logic results selectively appear at each output selector unit for the common inputs and remaining inputs, or for the common inputs and remaining inverted inputs, based upon the conditions of these remaining inputs.

In order to attain an accurate logic voltage for logical "0" (0 Volt) (RESET signal) at the output ports of those output selector units which are not selected by the input conditions, the pull-down transistors (QV1, QV2), which act as load transistors, are respectively connected between the drains of the parallel-connected transistors (Q13,Q14), (Q23,Q24), (Q33,Q34), and (Q43,Q44), within the output selector unit, and the ground terminal. Moreover, each gate of these pull-down transistors is applied to the output port VO of the level shifter, which generates the voltage that can turn these transistors ON.

Figure 1:
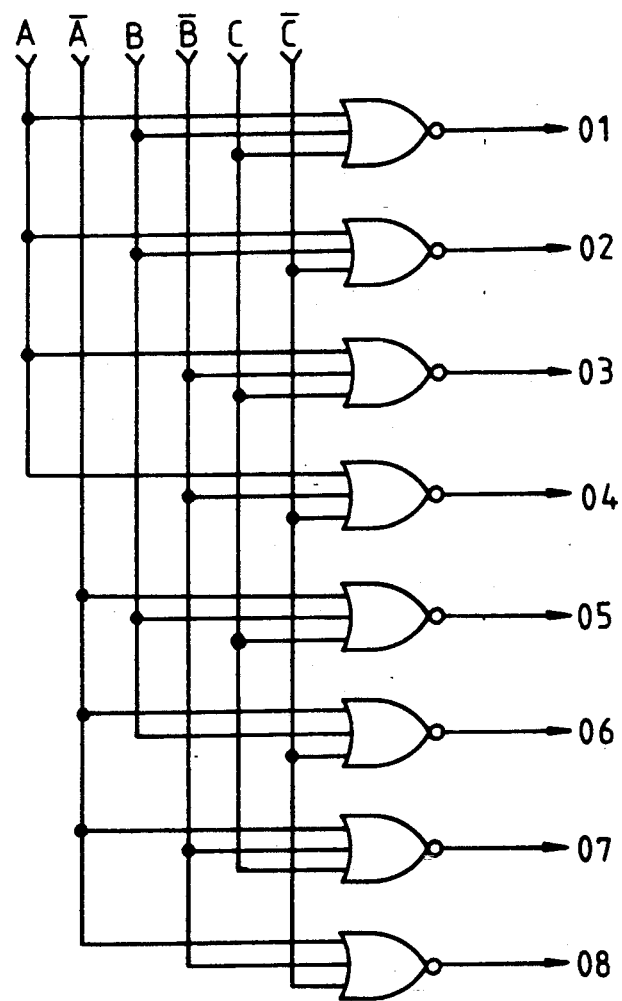
FIG. 1 shows a circuit diagram illustrating the conventional structure of a 3-input decoder.
Figure 2:
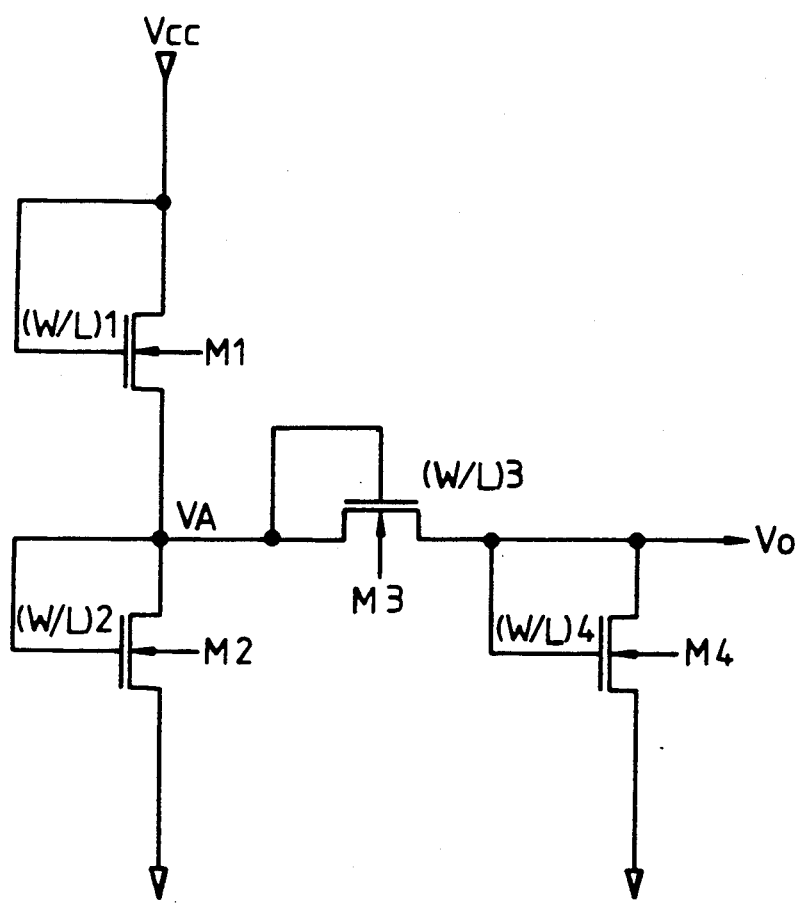
FIG. 2 shows a circuit diagram illustrating the structure of the level shifter circuit used in the decoder according to the invention.

The level shifter is used to maintain a low impedance condition by shifting the direct current voltage in parallel between the input and the output ports, and has the structure shown in FIG. 2. Its operation will be discussed below. In order to set the output port VO under the low impedance condition, assume that the DC voltage Vcc=5 V, the threshold voltage VT=0.8 V, and the aspect ratios of the transistors M1, M2, M3, and M4 are $(W/L)_1=(12/5)$, $(W/L)_2=(5/7)$, $(W/L)_3=(16/10)$, and $(W/L)_4=(8/4)$, respectively. The aspect ratios can be adjusted according to the output conditions desired. Suppose that both the transistors M3 and M4 are saturated, then the relation between the terminal voltage VA and the output voltage VO is $$\beta(W/L)_1(VA-VO-VT)^2 = \beta(W/L)_4(VO-VT)^2$$

Insert the appropriate values in the equation and solve the equation, which becomes:

$$VO = \frac{0.9VA + 0.1VT}{1 + 0.9} = 0.5VA$$

Therefore, supposing that the transistors M1, M2, and M3 are all saturated, then from the equation $$\beta(W/L)_1(Vcc-VA-VT)^2 = \beta(W/L)_2(VA-VT)^2 + \beta(W/L)_3(VA-VO-VT)^2$$

the following results are obtained:
VA=2.8 V
VO=1.4 V

If the output port VO of the level shifter is always assigned to "SET" (HIGH) condition, the pull-down transistors (QV1) and (QV2) connected to the output port VO always remain "ON", and those outputs which are not selected by any input combinations will be set to the "LOW" condition, with an accurate output level (=0 Volt).

In addition, in order to increase the speed of operation, only the n-channel transistors are used in this invention. Therefore the operational speed is two times faster than that of conventional circuitry, because the requisite time for specifying the state of one output line corresponds to the delay time of the three n-channel transistors.

The following is the description of the procedures on how the decoder adopting the level shifter according to the invention can decode arbitrary input signals and select a particular output. For example, assume that the 3-bit signal 010 is entered. Then, the signal line A, $\overline{A}$, B, $\overline{B}$, C, and $\overline{C}$ will become "LOW", "HIGH", "HIGH", "LOW", "LOW", and "HIGH", respectively. The transistors Q14, Q24, Q34, and Q44 along the "LOW"-state signal line C will be turned off, and, therefore, the pull-down transistor QV2, being always turned on due to "HIGH" signal from the output port VO of the level shifter, regardless of other transistors, so that the output lines 02, 04, 06, and 08 can be always in the "LOW" state. Transistors Q31 and Q41 are turned off by the "LOW" state signal line A and the output lines 05 and 07 are kept in the "LOW" state by the pull-down transistor QV1 being always turned on. The remaining problem is to select one of the output lines 01 or 03. Since the transistor Q12, being turned off by the signal line $\overline{B}$ of the "LOW" state, enables the output line 01 to be kept in "LOW" state, only the output line 03 can be finally selected. That is, since the transistors Q21, Q22, and Q23 of output selector unit 2 are turned on by the "HIGH" state input lines $\overline{A}$, B, and $\overline{C}$, the voltage of power supply Vdd sets the output line 03 to the "HIGH" state and, as a result, only one output line 03 out of the output lines 01–08 can be selected. The operations of other input combinations are performed in the same way, to enable selection of a specific output line.

As discussed above, the number of transistors including the conventional and the newly-invented circuits, and the operating speed for a 3-input decoder, are compared in Table 2.

TABLE 2

| Performance | Type | |
|---|---|---|
| | Conventional 3-input decoder | Newly-Invented 3-input decoder |
| No. of Tr's | 48 | 28 |
| Operational Speed | 2× | 1× |

The decoder according to the present invention can be used not only for 3-input and 8-input types, but also for 4-input and 16-output types: and can double the integrity from that is provided by the conventional decoder, and can increase the speed of operation to twice of conventional decoders.

What is claimed is:

1. A decoder circuit for generating a decoded signal to one specific output line in response to input signals of a specific combination, said decoder circuit comprising:
   a plurality of output selectors for respectively providing different decoded output signal lines, and for receiving said input signals in groups having common input components, remaining input components and inverted components of said remaining input components, said common input components not including said remaining input components and inverted components of said remaining input components;
   each of said output selectors comprising:
      a plurality of serially-connected transistors of a first conductivity type with a drain or source of a penultimate one of said serially-connected transistors being coupled to only a source or drain of only a final one of said serially-connected transistors, said plurality of serially-connected transistors performing preliminary logic products for said common input components received by respective gates thereof exclusive of said remaining input components and said inverted components of said remaining input components, and
      a plurality of parallel-connected transistors of said first conductivity type for performing secondary logic products for said remaining input components and remaining inverted input components received by the respective gates thereof in dependence upon said preliminary logic products, first ones of the coupled sources or drains of said parallel-connected transistors being connected to the drain or source of said final one of said serially-connected transistors, while said different decoded output signal lines are drawn from the respective second ones of the drains or sources of said parallel-connected transistors not coupled to said final one of said serially-connected transistors,
      whereby output logic results may be selectively output to one of said decoded output signal lines for the common input components and remaining input components, or for the common input components and inverted components, based upon the conditions of said remaining input components; and
   each output selector being provided with a plurality of transistors, acting as load transistors, coupled between the drains or sources of said parallel-connected transistors and the ground terminal, the respective gates of said pull-down transistors being coupled to an output of a level shifter that generates voltage to turn said pull-down transistors on, in order to generate a RESET signal with a logic voltage at the decoded output signal lines not selected by any combination of input signals.

2. A decoder circuit according to claim 1, further comprised of said first ones of the coupled sources or drains of said parallel-connected transistors being coupled together to said final one of said serially-connected transistors, and said respective ones of the drains or sources of said parallel-connected transistors being coupled to a reference potential.

3. A decoder circuit according to claim 1 wherein, each of said transistors comprises a metal oxide semiconductor transistor.

4. A decoder circuit according to claim 1, wherein each of said transistors comprises an n-channel metal oxide semiconductor transistor.

5. A decoder circuit according to claim 4, further comprised of said first ones of the sources or drains of said parallel-connected transistors being coupled together to said final one of said respective second ones of the serially-connected transistors, and said drains or sources of said parallel-connected transistors being coupled to said reference potential.

6. A decoder circuit for generating a decoded signal to one specific output line in response to input signals of a specific combination, said decoder circuit comprising:
   a plurality of output selector means for respectively providing different decoded output signal lines, and for receiving said input signals in groups having common input components, remaining input components and inverted components of said remaining input components, said common input components being exclusive of said remaining input components and said inverted components of said remaining input components;
   each of said output selector means having a plurality of serially-connected transistors of a first conductivity type with a drain or source of penultimate one of said serially-connected transistors being coupled to only a source or drain or only a final one of said serially-connected transistors, said plurality of serially-connected transistors performing preliminary logic products for the common input components received by the respective control electrodes thereof exclusive of said remaining input components and said inverted components of said remaining input components, and a plurality of parallel-connected transistors of said first conductivity type for performing secondary logic products for remaining input components and inverted components received by respective control electrodes thereof in dependence upon said preliminary logic products, coupled first principal conduction path electrodes of said parallel-connected transistors being connected to a principal conduction path electrode of said final one of said serially-connected transistors, while said different decoded output signal lines are drawn from respective second principal conduction path electrodes of said parallel-connected transistors, whereby output logic results are selectively provided to one of said decoded output signal lines for the common components and remaining input components, or for the common components and inverted components, based upon the conditions of said remaining components.

7. A decoder circuit according to claim 5, wherein each of said output selector means further comprises pull-down transistors, acting as load transistors, provided between the conduction path electrodes of said parallel-connected transistors and a reference terminal, the respective control electrodes of said pull-down transistors being coupled to an output of a level shifter for generating voltage to turn said pull-down transistors to an ON state, in order to generate a RESET signal with an accurate logic voltage at a decoded output signal line not selected by any combination of input signals.

8. A decoder circuit according to claim 7, wherein each of said transistors comprises an n-channel metal oxide semiconductor transistor.

9. A decoder circuit according to claim 7, further comprised of said first principal conduction path electrodes of said parallel-connected transistors being coupled together to said final one of said serially-connected transistors, and said second principal conduction path electrodes of said parallel-connected transistors being coupled to corresponding ones of said pull-down transistors.

10. A decoder circuit according to claim 6, wherein each of said transistors comprises an n-channel metal oxide semiconductor transistor.

11. A decoder circuit according to claim 6, further comprised of said first principal conduction path electrodes of said parallel-connected transistors being coupled together to said final one of said serially-connected transistors, and said second principal conduction path electrodes of said parallel-connected transistors being coupled to a reference potential.

12. A decoder circuit, comprising:
a plurality of output selectors responsively coupled to different decoded output signal lines, and for receiving input signals in groups having common input components, remaining input components and inverted components of said remaining input components, said common input components being exclusive of said remaining input components and said inverted components of said remaining input components;
each of said output selectors including a plurality of serially-connected transistors of a first conductivity type with a drain or source of a penultimate one of said serially-connected transistors being coupled to only a source or drain of only a final one of said serially-connected transistors, said plurality of serially-connected transistors performing preliminary first logic products for said common input components received by respective control electrodes of said serially-connected transistors exclusive of said remaining input components and said inverted components of said remaining input components, and a plurality of parallel-connected transistors of said first conductivity type for performing secondary logic products for said remaining input components and inverted components received by respective control electrodes of said parallel connected transistors in dependence upon said first logic products, coupled first principal conduction path electrodes of said parallel-connected transistors being connected to a conduction path electrode of said final one of said serially-connected transistors, while said different decoded output signal lines are drawn from respective second principal conduction path electrodes of said parallel-connected transistors.

13. A decoder circuit according to claim 12, wherein each output selector further comprises pull-down transistors acting as load transistors, provided between the second principal conduction path electrodes of said parallel-connected transistors and a reference terminal, respective control electrodes of said pull-down transistors being coupled to an output of a level shifter for generating voltage to turn said pull-down transistors to an ON state, in order to generate a RESET signal with a logic voltage at a decoded output signal line not selected by any combination of input signals.

14. A decoder circuit according to claim 13, further comprised of said first principal conduction path electrodes of said parallel-connected transistors being coupled together to said final one of said serially-connected transistors, and said second principal conduction path electrodes of said parallel-connected transistors being coupled to corresponding ones of said pull-down transistors.

15. A decoder circuit according to claim 12, further comprised of said first principal conduction path electrodes of said parallel-connected transistors being coupled together to said final one of said serially-connected transistors, and said second principal conduction path electrodes of said parallel-connected transistors being coupled to a reference potential.

16. A decoder circuit, comprising:
a plurality of conducting means for conducting a group of n input signals and n inverted said input signals, said group including common signals, remaining signals and inverted said remaining signals, said common signals not including said remaining signals and inverted remaining signals;
a plurality of decoding stages, each of said decoding stages comprising:
a first plurality of transistors having principal current conducting electrodes serially-connected between a terminal for a source of electrical potential and a first node with a principal current conducting electrode of a penultimate one of said serially-connected transistors being coupled to only a principal current conducting electrode of only a final one of said serially-connected transistors, control electrodes of said penultimate and final ones of said first plurality of transistors being connected to different ones of said conducting means conducting different ones of said input signals exclusive of said remaining signals and inverted said remaining signals;
a second plurality of transistors each having first principal current conducting electrodes coupled to said first node, second principal current conducting electrodes connectable to reference potentials, and control electrodes coupled to different ones of said conducting means conducting said remaining signals and inverted said remaining signals exclusive of said common signals; and
a plurality of signal providing means coupled to different ones of said second principal current conducting electrodes of respective ones of each of said second plurality of transistors, for providing output signals in dependence upon logic states of said common signals applied via said different ones of said conducting means to said control electrodes of said first plurality of transistors, and upon logic states of said remaining signals and inverted said remaining signals applied via said different ones of said conducting means to said control electrodes of said second plurality of transistors.

17. The decoder of claim 16, further comprised of said first and second pluralities of transistors being of the same conductivity type.

18. The decoder of claim 16, further comprised of:
said first plurality of transistors in each of said decoding stages being less than n in number; and
said second plurality of transistors in each of said decoding stages being of less than n in number.

19. The decoder of claim 16, further comprised of a third plurality of transistors, coupled between the second principal conduction path electrodes of said parallel-connected transistors and terminals for the reference potentials, respective control electrodes of said third plurality of transistors being coupled to an output of a level shifter for generating voltage to turn said third plurality of transistors to an ON state and thereby generate a RESET signal with an accurate logic voltage at a decoded output signal line.

20. The decoder of claim 19, wherein each of said transistors in said first, second and third pluralities of transistors comprises an n-channel metal oxide semiconductor transistor.

21. The decoder of claim 19, further comprised of:
said first plurality of transistors in each of said decoding stages being less than n in number; and
said second plurality of transistors in each of said decoding stages being less than n in number.

22. In a decoder circuit for decoding $m = 2^n$ n-bit combinational signals comprising a plurality of output selector means each inputting a pair of combinational signals having identical remaining bits except one bit among said m combinational signals and generating each decoding output corresponding to said pair of combinational signals according to the state of said one bit, each of said output selector means comprising:
at least two first transistors having serially-connected channels coupled between a power source terminal and a first node, with a channel of a penultimate one of said first transistors being coupled to only a channel of only a final one of said first transistors, and having gate coupled to receive different ones of the respective identical bit signals of said pair of combinational signals;
a plurality of second transistors, each having a channel connected between said first node and different ones of a pair of output terminals, and each having a gate coupled to receive different ones of the non-inverted state and inverted state of said one bit signal; and
a plurality of third transistors, each having a channel connected between different ones of said pair of output terminals and a grounded potential, and each having gate electrodes coupled to respond according to a control voltage applied to gates thereof.

23. A decoder circuit as claimed in claim 23, further comprising a level shifter for generating said control voltage supplied to the gates of third provided as a pull-down load with respect to said output terminal.

24. A decoder circuit as claimed in claim 23, wherein said level shifter comprises:
a plurality of fourth transistors, each having a channel serially connected between said power source terminal and said grounded potential, and each having a gate connected to a drain thereof, for generating a node voltage shifted to a desired level from a voltage of said power source terminal to a common connecting node thereof; and
a plurality of fifth transistors, each having a channel serially connected between said node voltage and said grounded potential and each having a gate connected to a drain thereof, respectively, for generating said control voltage by shifting said node voltage by shifting said node voltage to a different level.

* * * * *

UNITED STATES PATENT AND TRADEMARK OFFICE
CERTIFICATE OF CORRECTION

PATENT NO. : 5,157,283

DATED : October 20, 1992

INVENTOR(S) : Tae-hun Jin

It is certified that error appears in the above-identified patent and that said Letters Patent is hereby corrected as shown below:

On the title page, item [75] Inventor: change "Tae-hun Kin" to --Tae-hun Jin--.

Column 1, line 41, before "run" change "line" to --long--.

Column 1, line 59, before "decoder" change ",said" to --. The--.

Column 1, line 60, after "circuit" change "including" to --includes--.

Column 3, line 18, after "operation" delete "i.e.".

Signed and Sealed this

Fifteenth Day of April, 1997

*Attest:*

BRUCE LEHMAN

*Attesting Officer*  *Commissioner of Patents and Trademarks*